United States Patent [19]

Yoshida et al.

[11] Patent Number: 5,586,135

[45] Date of Patent: Dec. 17, 1996

[54] SEMICONDUCTOR LASER HAVING AN ALGAINP CLADDING LAYER

[75] Inventors: Ichiro Yoshida; Tsukuru Katsuyama; Jun-ichi Hashimoto, all of Kanagawa, Japan

[73] Assignee: Sumitomo Electric Industries, Ltd., Osaka, Japan

[21] Appl. No.: 174,067

[22] Filed: Dec. 28, 1993

[30] Foreign Application Priority Data

Dec. 28, 1992 [JP] Japan .................... 4-349280
Apr. 21, 1993 [JP] Japan .................... 5-94382
Jul. 29, 1993 [JP] Japan .................... 5-188341

[51] Int. Cl.$^6$ .................... H01S 3/18
[52] U.S. Cl. .................... 372/45
[58] Field of Search .................... 372/45, 46

[56] References Cited

U.S. PATENT DOCUMENTS

| | | | |
|---|---|---|---|
| 4,964,135 | 10/1990 | Mitsui et al. | 372/46 |
| 5,146,466 | 9/1992 | Hamada et al. | 372/45 |
| 5,210,767 | 5/1993 | Arimoto et al. | 372/46 |
| 5,222,090 | 6/1993 | Serreze | 372/45 |
| 5,274,656 | 12/1993 | Yoshida | 372/45 |
| 5,282,218 | 1/1994 | Okajima et al. | 372/46 |
| 5,321,712 | 6/1994 | Itaya et al. | 372/43 |

FOREIGN PATENT DOCUMENTS 4-150087  5/1992  Japan .................... 372/45

OTHER PUBLICATIONS

Kidoguchi et al., I–L characteristics of AlGaInP visible laser diode with lateral leaky waveguide structure, The Autumn Conference of the Japan Society of Applied Physics, Paper No. 18–V–5 1992, (No month), p. 952 * Abstract * .

Mobarhan et al., GainInAs/GaAs/GaInP buried ridge structure single quantum well laser emitting at 0.98 mum, Electronics Letters, vol. 28, No. 16, Jul. 30, 1992, pp. 1510–1511.

Patent Abstracts of Japan, vol. 13, No. 468 (E–834), Oct. 1989, JP-A-01 181 493 (Sharp Corp.).

Yoshida et al., AlGaInP/GaInAs strained quantum well lasers, Electronics Letters, vol. 29, No. 8, Apr. 15, 1993, pp. 654–655.

Wu et al., High Temperature, high power InGaAs Quantum well lasers with lattice matched InGaP Claddings, IEEE Photonics Technology Letters, vol. 4, No. 7, Jul. 1992.

Itaya et al, Remarkable improvment in the temperature characteristics of GaAs lasers using an InGaAlp cladding Layer, Conference Digest, 13th IEEEE International Semiconductor Laser Conference, Sep. 21–25, 1992, pp. 236–237.

Patent Abstracts of Japan, vol. 16, No. 224 (E–1206), May 25, 1992, JP-A–04 039 986 (Fujitsu Ltd.).

Fukagai, et al: "High–Power 1–02 um InGaAs/AlGaAs strained quantum well lasers with GaInP buried wavelength for pumping Pr3±Doped Optical Fibre Amplifier" Electronics Letters Jan. 21, 1993, vol. 29 No. 2.

*Primary Examiner*—Rodney B. Bovernick
*Assistant Examiner*—Robert McNutt
*Attorney, Agent, or Firm*—Cushman Darby & Cushman, L.L.P.

[57] ABSTRACT

A semiconductor laser includes a GaAs substrate, an active layer made of a semiconductor material having a band gap energy smaller than that of GaAs, and a top clad having an AlGaInP cladding layer. An index antiguiding type semiconductor laser is constituted based on the above structure. The top clad includes a base layer formed on the active layer and a protrusion strip for current injection protruding from the base layer and having an AlGaInP cladding layer. An AlGaInP light diffusion layer with an Al proportion smaller than that of the AlGaInP cladding layer and inclusive of zero is formed on the base layer adjacent to the protrusion strip. The base layer has a thickness so as to allow laser oscillation light to leak out to the light diffusion layer.

8 Claims, 9 Drawing Sheets

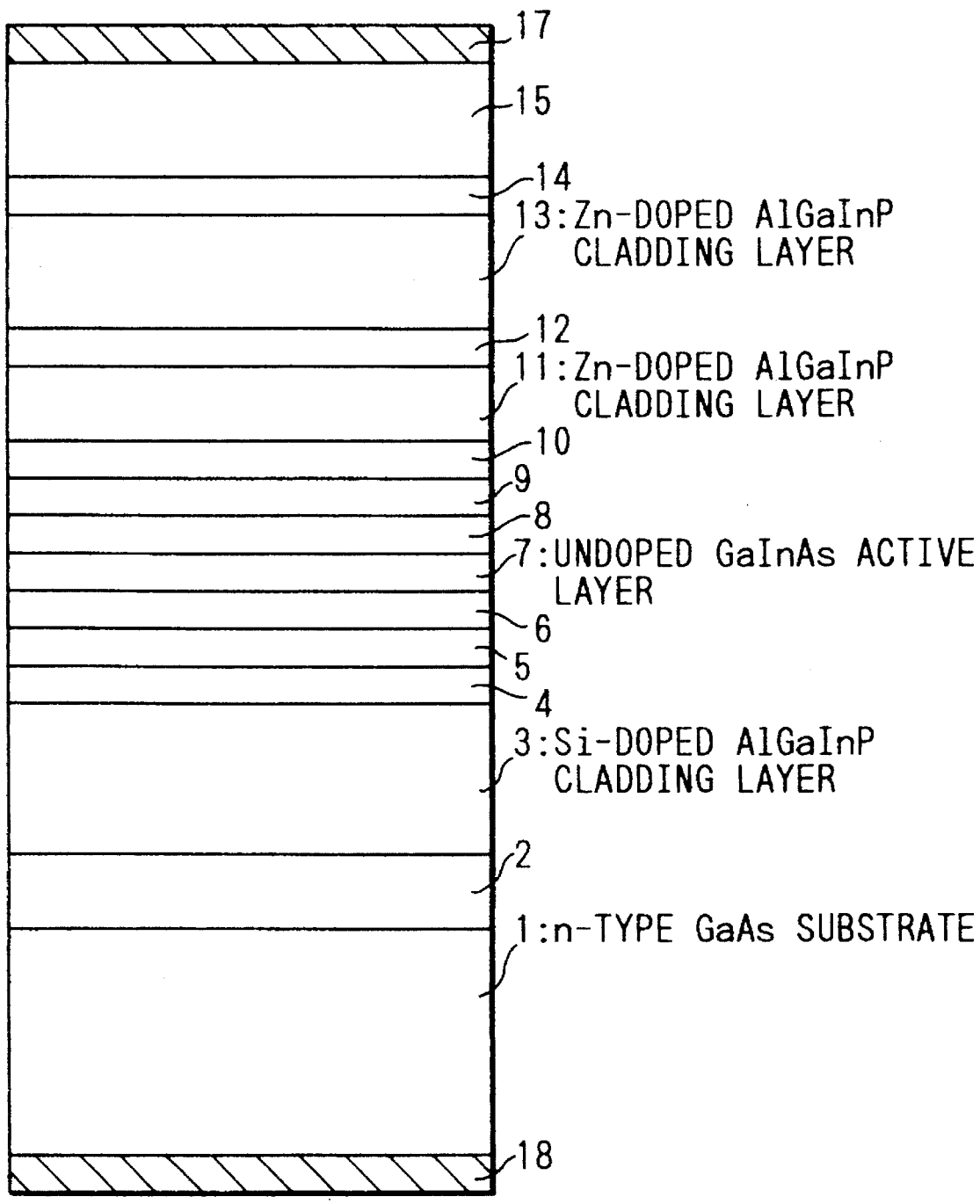

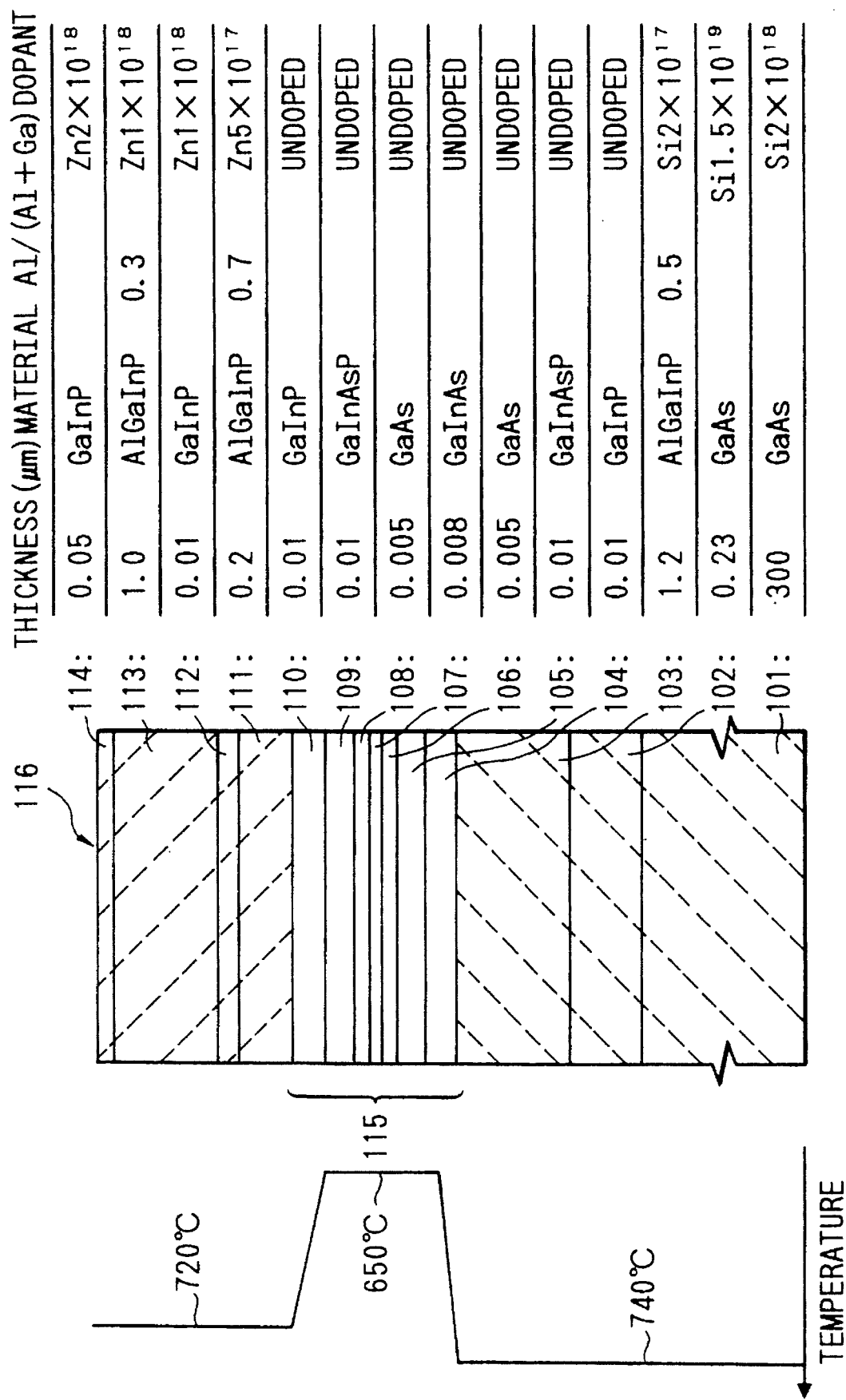

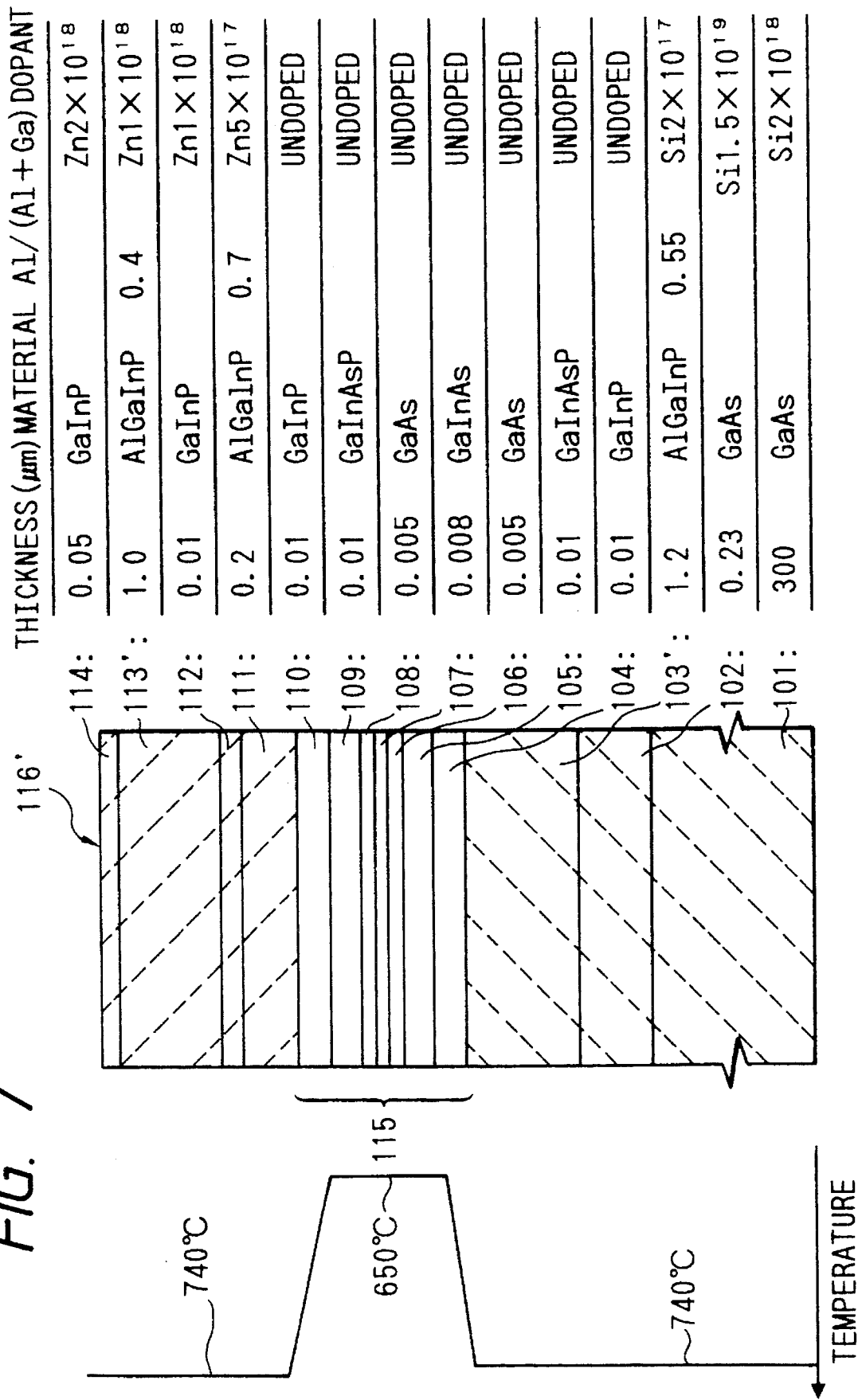

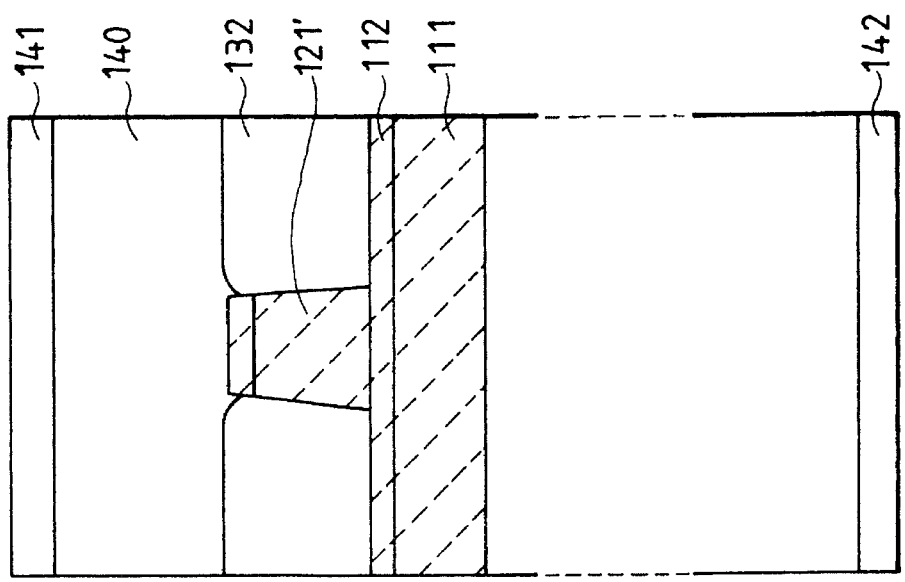
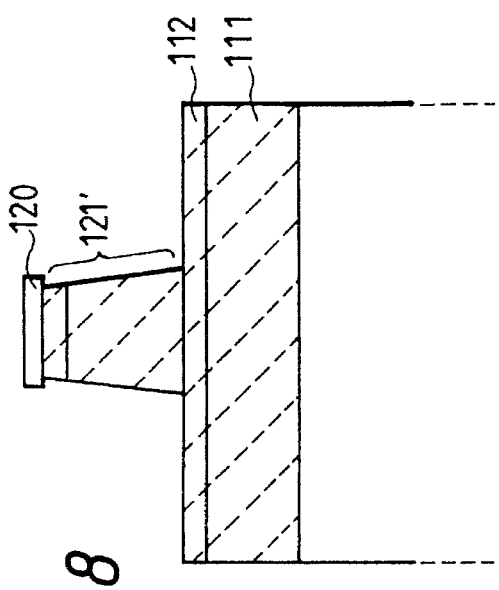
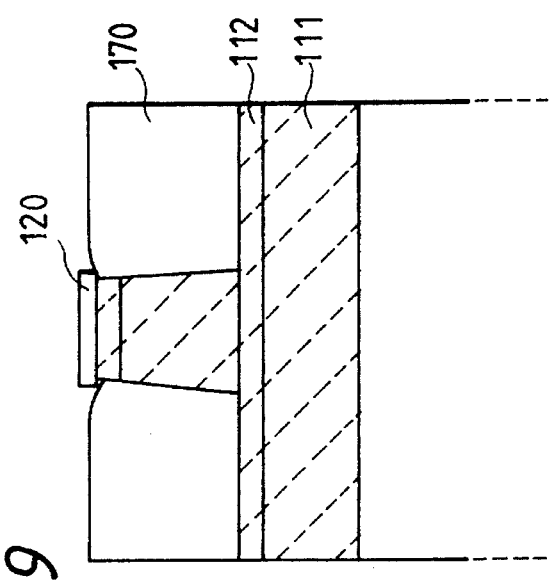

| THICKNESS | MATERIAL | Al/(Al+Ga) | DOPANT | n OR p | COMMENT |
|---|---|---|---|---|---|
| 0.05 μm | GaInP | | Zn | 2.0E+18 | |
| 1.0 μm | AlGaInP | 0.3 | Zn | 1.0E+18 | |
| 0.005 μm | GaAs | | Zn | 1.0E+19 | ETCHING STOPPER |
| 0.2 μm | AlGaInP | 0.7 | Zn | 5.0E+17 | |
| 0.01 μm | GaInP | | UNDOPED | | |
| 0.01 μm | GaInAsP | | UNDOPED | | |
| 0.005 μm | GaAs | | UNDOPED | | |
| 0.008 μm | GaInAs | | UNDOPED | | |
| 0.005 μm | GaAs | | UNDOPED | | |
| 0.01 μm | GaInAsP | | UNDOPED | | |
| 0.01 μm | GaInP | | UNDOPED | | |
| 1.2 μm | AlGaInP | 0.5 | Si | 2.0E+17 | |
| 0.23 μm | GaAs | | Si | 1.5E+19 | |
| 300 μm | GaAs | | Si | 2.0E+18 | |

FIG. 13

| THICKNESS | MATERIAL | Al/(Al+Ga) | DOPANT | n OR p | COMMENT |
|---|---|---|---|---|---|
| 0.05 μm | GaInP | | Zn | 2.0E+18 | |
| 1.2 μm | AlGaInP | 0.3 | Zn | 1.0E+18 | |
| 0.01 μm | GaInP | | Zn | 1.0E+18 | ETCHING STOPPER |
| 0.3 μm | AlGaInP | 0.3 | Zn | 5.0E+17 | |
| 0.01 μm | GaInP | | UNDOPED | | |
| 0.01 μm | GaInAsP | | UNDOPED | | |
| 0.005 μm | GaAs | | UNDOPED | | |
| 0.008 μm | GaInAs | | UNDOPED | | |
| 0.005 μm | GaAs | | UNDOPED | | |
| 0.01 μm | GaInAsP | | UNDOPED | | |
| 0.01 μm | GaInP | | UNDOPED | | |
| 1.5 μm | AlGaInP | 0.3 | Si | 2.0E+17 | |
| 0.23 μm | GaAs | | Si | 1.5E+19 | |
| 300 μm | GaAs | | Si | 2.0E+18 | |

SEMICONDUCTOR LASER HAVING AN ALGAINP CLADDING LAYER

BACKGROUND OF THE INVENTION

The present invention relates to a semiconductor laser usable for pumping an Er-doped quartz optical fiber amplifier and other purposes. The invention also relates to a stripe-type semiconductor laser having a GaAs substrate.

An Er-doped quartz optical fiber amplifier now attracts much attention as being a device and technology important to the next generation of optical communication systems. A semiconductor laser having a wavelength of 1.48 μm or 0.98 μm is used as a pumping light source for that optical amplifier. There has been proposed a 0.98-μm semiconductor laser which has a GaInAs active layer and AlGaAs or GaInP cladding layers.

In general, to increase the efficiency of introducing laser output power to an optical fiber by elongating a near-field pattern in the vertical direction, an active layer and optical confinement layers need to be made thinner. However, thinning the active layer and optical confinement layers deteriorates the optical confinement efficiency. As a result, carriers are confined insufficiently, to thereby deteriorate the temperature characteristics of the semiconductor laser. Due to the above phenomena inherent in a semiconductor laser, the above-mentioned 0.98-μm semiconductor laser cannot satisfy both requirements of high output power and superior temperature characteristics which are required for a pumping light source for the Er-doped quartz optical fiber amplifier.

Turning to another subject, it is known to use a 1-μm-band semiconductor laser, which uses a silicon oxide film or a silicon nitride film, to confine light and current. While this type of conventional semiconductor laser can be manufactured easily, it has a disadvantage of low heat dissipation.

In view of the above, semiconductor lasers are now being developed in which light and current are confined by a structure made of only semiconductors. In the case of semiconductor lasers in which the energy of oscillation light is greater than or equal to the band gap energy of GaAs, light can be substantially confined by forming a mesa portion (protrusion strip) in a clad and filling the side regions of the mesa portion with GaAs, where the side portions absorb guided light. Because this type of structure has not yet been employed in 1-μm-band semiconductor lasers, various attempts to do so have been made with respect to the 1 μm-band semiconductor lasers.

Among those attempts, a technique of filling the side regions of a clad mesa portion with a material whose effective refractive index is smaller than the clad is now being investigated actively, because this type of structure can be produced relatively easily. Two examples of this technique are discussed below. In the first example, a clad is made of AlGaAs and the side regions of a meas portion is filled with GaInP whose refractive index is smaller than AlGaAs (see Chida et al., The 40th Spring Conference of the Japan Society of Applied Physics, Presentation No. 1a-C-2 (1993)). In the second example, a mesa portion including a high-refractivity GaAs layer is formed in a clad made of GaInP, and the side regions of the GaAs layer is filled with GaInP (see Sagawa et al., The 40th Spring Conference of the Japan Society of Applied Physics, Presentation No. 31p-C-11 (1993)).

These two techniques employ the real refractive index waveguide structure, in which the side regions of a mesa portion are filled with a low-refractivity material. On the other hand, a red semiconductor laser of an index antiguiding structure has been proposed in which the side regions of a mesa portion of an AlGaInP clad are filled with AlGaInP of a smaller Al proportion (see Kidoguchi et al., The Autumn Conference of the Japan Society of Applied Physics, Presentation No. 18a-V-5 (1992)). Since this index antiguiding structure can produce a large difference between thresholds of the fundamental transverse mode and higher order transverse modes, it can readily provide a single transverse mode operation.

However, the first conventional technique of Chida et al. has a problem of a small control range of optical confinement, because the clad material is limited to AlGaAs whose refractive index is larger than GaInP as the embedding material. In the second conventional technique of Sagawa et al., the increase of the refractive index difference in the horizontal direction will necessarily be associated with excessive concentration of light in the GaAs layer.

Further, the third conventional technique of Kidoguchi et al., wherein the index antiguiding structure can readily provide a single transverse mode operation, requires the AlGaInP light diffusion layer (which buries the mesa portion (protrusion strip)) to have a small Al proportion (Ga/(Al+Ga)) of 0.6. It is difficult to control growth conditions and pre-treatment conditions of the growth of the AlGaInP light diffusion layer. That is, because the active layer of the semiconductor laser of Kidoguchi et al. is made of GaInP, whose band gap energy is much larger than GaAs, the Al proportion of the clad needs to be increased to effectively confine carriers, necessitating the increase of the Al proportion of the light diffusion layer.

SUMMARY OF THE INVENTION

An object of the present invention is to provide a semiconductor laser having high output power and superior temperature characteristics specifically suitable for use as a pumping light source for an Er-doped optical fiber amplifier.

Another object of the invention is to provide an index antiguiding type semiconductor laser which can confine light and current by a structure made of only semiconductor materials and can easily provide a single transverse mode operation, and which can control optical confinement in both of the vertical and horizontal directions.

According to the invention, a semiconductor laser comprises:

a GaAs substrate;

an active region including active layer made of a semiconductor material having a band gap energy smaller than that of GaAs; and a top clad located on a side opposite to the GaAs substrate and comprising a first cladding layer made of AlGaInP.

It is preferred that AlGaInP of the first cladding layer be substantially lattice-matched with GaAs (that is, it is expressed as $(Al_xGa_{1-x})_{0.5}In_{0.5}P$), and that the Al proportion in terms of Al/(Al+Ga) is not less than 0.5. A carrier (electron) overflow from the active region to the p-type cladding layer is the main factor of a loss occurring in high-current injection. To suppress the carrier overflow, it is effective to increase a barrier height between the active layer and the cladding layer (i.e., a conduction band discontinuity between GaInAs and AlGaInP). In AlGaInP with an Al proportion of 50%, the conduction band discontinuity is approximately twice that of GaInP.

Based on the above structure, an index antiguiding type semiconductor laser is constituted in which the top clad comprises a base layer formed on the active layer and a protrusion strip for current injection protruding from the base layer and comprising a second cladding layer made of AlGaInP. The semiconductor laser further comprises a light diffusion region formed on the base layer adjacent to the protrusion strip and having an Al proportion smaller than that of AlGaInP of the second cladding layer and inclusive of zero, wherein the base layer has such a thickness as allows laser oscillation light to leak out to the light diffusion layer.

Because AlGaInP (including the case where the Al proportion is zero) of the light diffusion layer has a refractive index larger than that of AlGaInP of the protrusion strip, light tends to diffuse in the horizontal direction. However, because of a gain obtained under the protrusion strip, the light is substantially concentrated in the central region to attain light guidance. Since the degree of light diffusion in the horizontal direction varies with the mode, the transverse mode can be controlled by adjusting the refractive index of the protrusion strip. If the Al proportion (Al/(Al+Ga)) of AlGaInP of the protrusion strip is increased (i.e., the refractive index is decreased) to provide a higher degree of diffusion, the gain becomes insufficient for light guidance. Conversely, if the Al proportion of AlGaInP of the protrusion strip is decreased (i.e., the refractive index is increased) to provide a lower degree of diffusion, higher order transverse modes become likely to occur. A single transverse mode operation is easily established if the Al proportion of the protrusion strip minus that of the light diffusion layer is set in the range of 0.1 to 0.4.

Since the light diffusion layer is epitaxially grown from the surface produced by shaping the protrusion strip and is therefore exposed to air, it is difficult to restart growth of AlGaInP. In the present invention, because the active layer is made of a material, for instance, GaInAs, whose band gap energy is smaller than that of GaAs, the Al proportion of AlGaInP of the light diffusion layer can be made sufficiently small. The growth of AlGaInP can be restarted more easily if its Al proportion is smaller. In view of this, it is preferred that the Al proportion of AlGaInP of the light diffusion layer not exceed 0.2.

Restarting of the AlGaInP growth of the light diffusion layer is further facilitated by forming, in advance, at least one of a GaAs and a GaAsP thin layer which include only one group III element. It is preferred that these layers have a total thickness less than about 50 Å, because if they are too thick the optical confinement in the horizontal direction is deteriorated. Where GaInP is used (that is, the Al proportion of AlGaInP is zero) for the light diffusion layer, it can be grown more easily.

The light distribution in the vertical direction can be controlled by changing the composition and thickness of AlGaInP of the base layer of the top clad which AlGaInP has an Al proportion larger than that of the protrusion strip. Further, if the longitudinal ends of the protrusion strip are spaced from the laser facets and the light diffusion layer is extended to fill the regions in between, the light expands in the facet portions to reduce the light density there and, therefore, the deterioration of the laser facets can be suppressed.

BRIEF DESCRIPTION OF THE DRAWINGS

FIG. 1 is a cross-section showing a vertical structure of a semiconductor laser according to a first embodiment of the present invention;

FIG. 2 is a cross-section showing an epitaxial wafer used for producing a semiconductor laser according to a second embodiment of the invention;

FIG. 7 is a cross-section showing an epitaxial wafer used for producing a semiconductor laser according to a third embodiment of the invention;

FIG. 8 is a cross-section showing a structure obtained by mesa-etching the structure of FIG. 7;

FIG. 9 is a cross-section showing a structure obtained after a light diffusion layer has been formed on the structure of FIG. 8;

FIG. 10 is a cross-section showing a structure obtained after a p-type GaAs film has been formed on the structure of FIG. 9;

FIG. 13 is a cross-section showing an epitaxial wafer used for producing a semiconductor laser according to a sixth embodiment of the invention.

DESCRIPTION OF THE PREFERRED EMBODIMENTS

Figure 5:
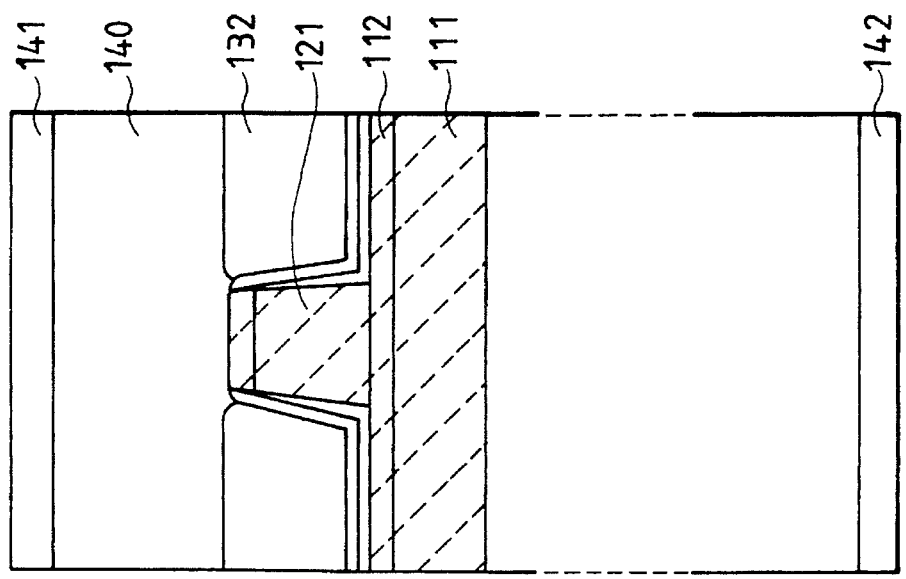
FIG. 5 is a cross-section showing a structure obtained after a p-type GaAs film has been formed on the structure of FIG. 4.

FIG. 1 schematically shows a vertical structure of a semiconductor laser according to a first embodiment of the present invention. Respective epitaxial layers 2–15 are formed on an n-type GaAs substrate 1 by a known metal organic vapor phase epitaxy (MOVPE). Materials and thicknesses of the respective epitaxial layers 2–15 are as follows. Reference numerals 17 and 18 denote a p-side electrode and an n-side electrode, respectively.

1st layer . . . n-type GaAs buffer layer 2 of 0.2 μm in thickness;

2nd layer . . . Si-doped AlGaInP cladding layer 3 ($x=$Al/(Al+Ga)$=0.7$, $n=2\times10^{18}$ cm$^{-3}$) of 1.5 μm in thickness;

3rd layer . . . Undoped AlGaInP cladding layer 4 ($x=0.1$) of 100 Å in thickness;

4th layer . . . Undoped GaInAsP optical confinement layer 5 (Eg$\approx$1.7 eV) of 100 Å in thickness;

5th layer . . . Undoped GaAs layer 6 of 100 Å in thickness;

6th layer . . . Undoped GaInAs active layer 7 of 40 Å in thickness;

7th layer . . . Undoped GaAs layer 8 of 100 Å in thickness;

8th layer . . . Undoped GaInAsP optical confinement layer (Eg=1.7 eV) of 100 Å in thickness;

9th layer . . . Undoped AlGaInP cladding layer 10 ($x=0.1$) of 100 Å in thickness;

10th layer . . . Zn-doped AlGaInP cladding layer 11 ($x=0.7$, $p=5\times10^{17}$ cm$^{-3}$) of 0.4 μm in thickness;

11th layer ... Zn-doped GaAs etching stopper layer 12 of 100 Å in thickness;

12th layer ... Zn-doped AlGaInP cladding layer 13 (x=0.7, p=5×10$^{17}$ cm$^{-3}$) of 1.1 μm in thickness;

13th layer ... Zn-doped AlGaInP buffer layer 14 (x=0.1) of 200 Å in thickness; and 14th layer ... Zn-doped GaAs contact layer 15 (p=1×10$^{19}$ cm$^{-3}$) of 0.5 μm in thickness.

As mentioned above, the values x of the AlGaInP layers 3, 4, 10, 11, 13 and 14 are composition ratios of Al to (Al+Ga). In this embodiment, AlGaInP of the respective layers is substantially lattice-matched with GaAs.

We will describe several points to be considered in conducting the epitaxial growth. To obtain high crystalline quality, it is preferred that the AlGaInP layers 3, 4, 10, 11, 13 and 14 be grown at temperatures about 50° C. higher than the GaInP layers. In this embodiment, for example, the n-type AlGaInP layer 3 is grown at 760° C., and the p-type AlGaInP layers 11, 13 and 14 are grown at 740° C. The flow rate of diethylzinc, which is a material gas of Zn as the p-type dopant, is set at the same level as in the case of forming the Zn-doped GaAs contact layer 15.

In the semiconductor laser according to this embodiment, since GaInAs is used for the active layer and AlGaInP is used for the cladding layers, a large difference can be obtained between the band gap energies of the active layer and the cladding layers. As a result, a large electron energy level difference is produced, and electrons are less likely to escape from the active layer, which means that the electron-hole recombination is effectively performed in the active layer. Thus, the semiconductor laser according to this embodiment can produce a sufficiently high output power suitable for a pumping light source for an Er-doped quartz optical fiber amplifier without deteriorating temperature characteristics.

Semiconductor lasers according to a second aspect of the invention will be described below.

In a semiconductor laser according to a second embodiment, an epitaxial wafer 116 having a multilayered structure of FIG. 2 is formed by a reduced pressure MOVPE at about 60 Torr.

An n-type GaAs buffer layer 102, an n-type AlGaInP cladding layer 103, an active region 115, a p-type AlGaInP cladding layer 111, a p-type GaInP etching stopper layer 112, a p-type AlGaInP cladding layer 113 and a p-type GaInP cap layer 114 are sequentially formed on a GaAs substrate 101 by epitaxial growth. The quantum well active layer 115 consists of a GaInP cladding layer 104, a GaInAsP optical confinement layer 105, a GaAs layer 106, a GaInAs quantum well layer 107, a GaAs layer 108, a GaInAsP optical confinement layer 109 and a GaInP cladding layer 110. The p-type AlGaInP cladding layer 111, p-type GaInP etching stopper layer 112, p-type AlGaInP cladding layer 113 and p-type GaInP cap layer constitutes a top clad. The p-type AlGaInP cladding layer 113 is shaped, by subsequent etching, into a protrusion strip that is coextensive and parallel with a current-injecting portion of the active layer.

Thicknesses, kinds and concentrations of dopants of the respective epitaxial layers are indicated in FIG. 2. Also shown in the left part of FIG. 2 is a variation of the temperature during the epitaxial growth. It is desired that AlGaInP for the clads be grown at a higher temperature, and that GaInAs for the active layer be grown at a lower temperature. In this embodiment, as shown in FIG. 2, the active region 115 is grown at 650° C. and the bottom and top clads are grown at 720°–740° C.

Figure 3:
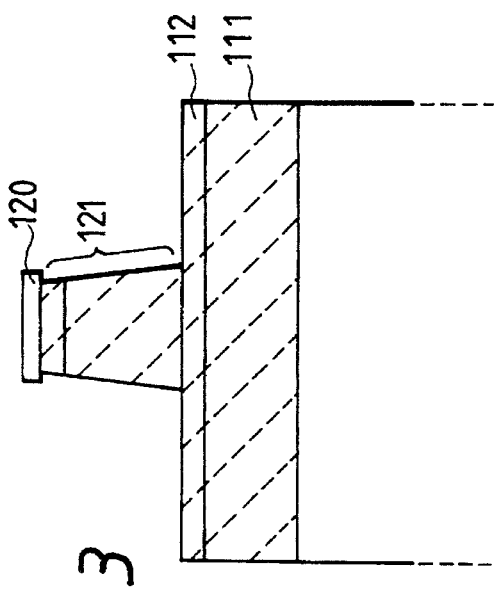
FIG. 3 is a cross-section showing a structure obtained by mesa-etching the epitaxial wafer of FIG. 2.

Then, unnecessary portions of the GaInP cap layer 114 and the AlGaInP cladding layer 113 of the thus formed epitaxial wafer 116 are removed by etching. First, a 0.1-μm-thick silicon nitride film is deposited on the entire surface, and patterned by a lithography technique to leave a 4-μm-wide band-like portion 120. Then, the GaInP cap layer 114 and the AlGaInP cladding layer 113 are etched using the silicon nitride film 120 as a mask (see FIG. 3). More specifically, first, the GaInP cap layer 114 and a very surface portion of the AlGaInP cladding layer 113 are etched out by a mixture at 50° C. of sulfuric acid, hydrogen peroxide and water which are mixed at a ratio of 3:1:1. Then, the AlGaInP cladding layer 113 is etched by concentrated sulfuric acid of 60° C. until the color of the wafer surface changes, which means exposure of the GaInP etching stopper layer 112. Thus, a protrusion strip 121 of the top clad is formed as shown in FIG. 3.

Figure 4:
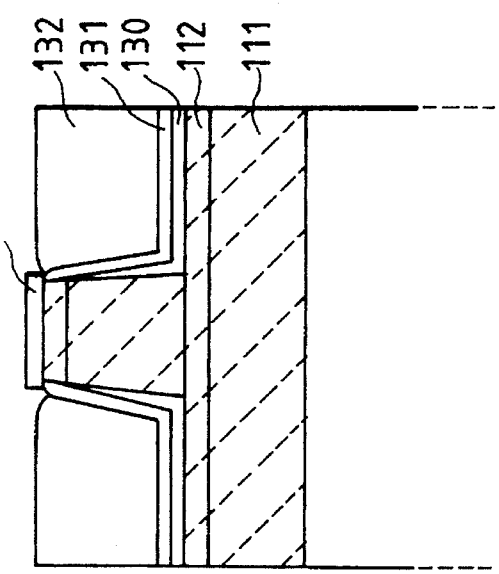
FIG. 4 is a cross-section showing a structure obtained after a light diffusion layer has been formed on the structure of FIG. 3.

Then, as shown in FIG. 4, a light diffusion layer 132 of n-type GaInP is formed so as to occupy both sides of the protrusion strip 121. A GaAs layer 130 and a GaAsP layer 131 are formed prior to the formation of the light diffusion layer 132. As a result of exposure to air, the wafer surface is rough at the time of restarting growth of the light diffusion layer 132. In particular, where the surface material includes two or more group III elements, the surface condition is bad, i.e., not suitable for the growth of the light-diffusion layer 132. The GaAs layer 130 and the GaAsP layer 131 serve to facilitate the growth of the light diffusion layer 132. The total thickness of the layers 130 and 131 should be less than about 50 Å, because if they are two thick, they will adversely affect the optical confinement in the horizontal direction. In this embodiment, the GaAs layer 130 is 30-Å thick and the GaAsP layer 131 is 10-Å thick. The composition of the GaAsP layer 130 need not be selected strictly. At 650° C., the mole ratio between arsine and phosphine may be set at about 0.1 and the mole ratio between the group V elements and the group III element may be set at about 70. The temperature should be raised in a phosphine atmosphere. Being of an n-type, the light diffusion layer 132 also serves as a current blocking layer.

Next, the silicon nitride film 120 is etched out by a solution of hydrofluoric acid and water (1:1), and a p-type GaAs film 140 is formed to have a thickness of 2 μm. A p-side electrode 141 is evaporated onto the p-type GaAs film 140. After the GaAs substrate 101 is thinned to about 100 μm, an n-side electrode 142 is evaporated onto it. After the electrodes 141 and 142 are alloyed with the adjacent layers by annealing, cleaving and mounting steps are performed to complete a semiconductor laser (see FIG. 5).

The optical confinement in both of the vertical and horizontal directions can be controlled by changing the thickness and composition (distribution) of a base layer of the top clad, i.e., the AlGaInP cladding layer 111 in this embodiment. Although in this embodiment the mesa shape of the protrusion strip 121 is an ordinary one (the top is narrower than the bottom), it may be a reversed one, in which case the stripe width can be reduced.

Figure 6:
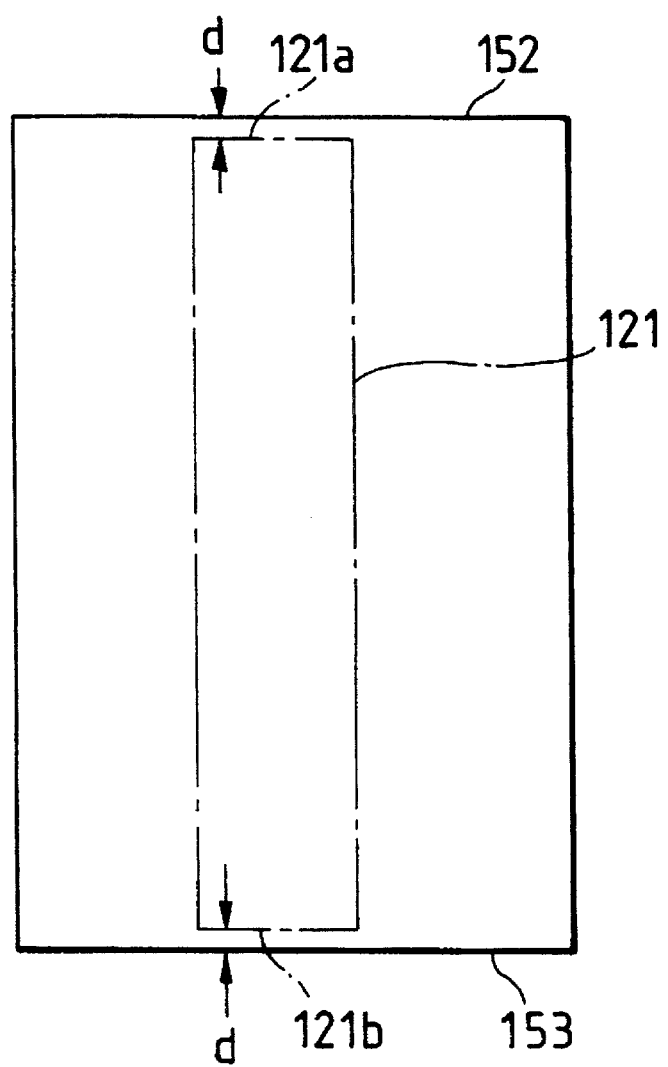
FIG. 6 is a top view showing an arrangement of a protrusion strip.

FIG. 6 is a top view corresponding to FIG. 5, and shows how the protrusion strip 121 is arranged on a chip as cut out. As shown in FIG. 6, ends 121a and 121b of the protrusion strip 121 are separated from facets 152 and 153. The light diffusion layer also fills the regions between the end 121a and the facet 152 and between the end 121b and the facet 153 in the same manner as in the lateral sides of the protrusion strip 121. It is preferred that distances d between the end 121a and facet 152 and between the end 121b and the facet 153 be about 20 μm. Base layers of the top clad, i.e., the p-type AlGaInP cladding layer 111 and the p-type GaInP etching stopper layer 112 extend to the facets 152 and 153. Since the above facet structure causes light diffusion in the vicinity of the facets, the light density can be reduced there.

A sudden failure may occur in semiconductor lasers having a GaInAs active layer. The sudden failure is caused by fusion of a facet, which is called a catastrophic optical damage (COD) and is considered as originating from an interaction between light and current at a facet portion. If the light density is reduced at the facet portions by using the facet structure of this embodiment, the COD will hardly occur to improve the reliability of the semiconductor laser.

In this embodiment, the above structure is employed in both facet portions. Where coatings of different reflectances are applied to the respective facets, the above structure may be employed only for the lower-reflectance-side facet, in which case the protrusion strip 121 is extended to the facet on the higher reflectance side.

FIG. 7 shows a multilayered structure of an epitaxial wafer to be used for producing a semiconductor laser according to a third embodiment of the invention. The third embodiment is different from the second embodiment in that the light diffusion layer uses, instead of GaInP, AlGaInP whose refractive index is larger than AlGaInP of the protrusion strip. To this end, as shown in FIG. 7, the AlGaInP cladding layers 103 and 113 of the epitaxial wafer 116 of the second embodiment are replaced by AlGaInP layers 103' and 113' having a large Al proportion to constitute an epitaxial wafer 116'. The procedure of forming the epitaxial wafer 116' is basically the same as in the second embodiment. In the third embodiment, the temperature in forming the top clad is a little higher than in the second embodiment (see FIG. 7).

After the formation of the epitaxial wafer 116', a protrusion strip 121' is formed by etching as shown in FIG. 8, and then a light diffusion layer 170 is formed as shown in FIG. 9 which is made of n-type AlGaInP having an Al proportion (Al/(Al+Ga)) of 0.2. Although in this embodiment the light diffusion layer 170 is formed directly on the etching stopper layer 112, to facilitate the epitaxial growth the GaAs layer 130 and the GaAsP layer 131 may be formed in advance as in the case of the second embodiment. Then, as in the case of the second embodiment, the p-type GaAs film 140 and the electrodes 141 and 142 are formed, and a chip is cut out to complete a semiconductor laser (see FIG. 10).

Figure 11:
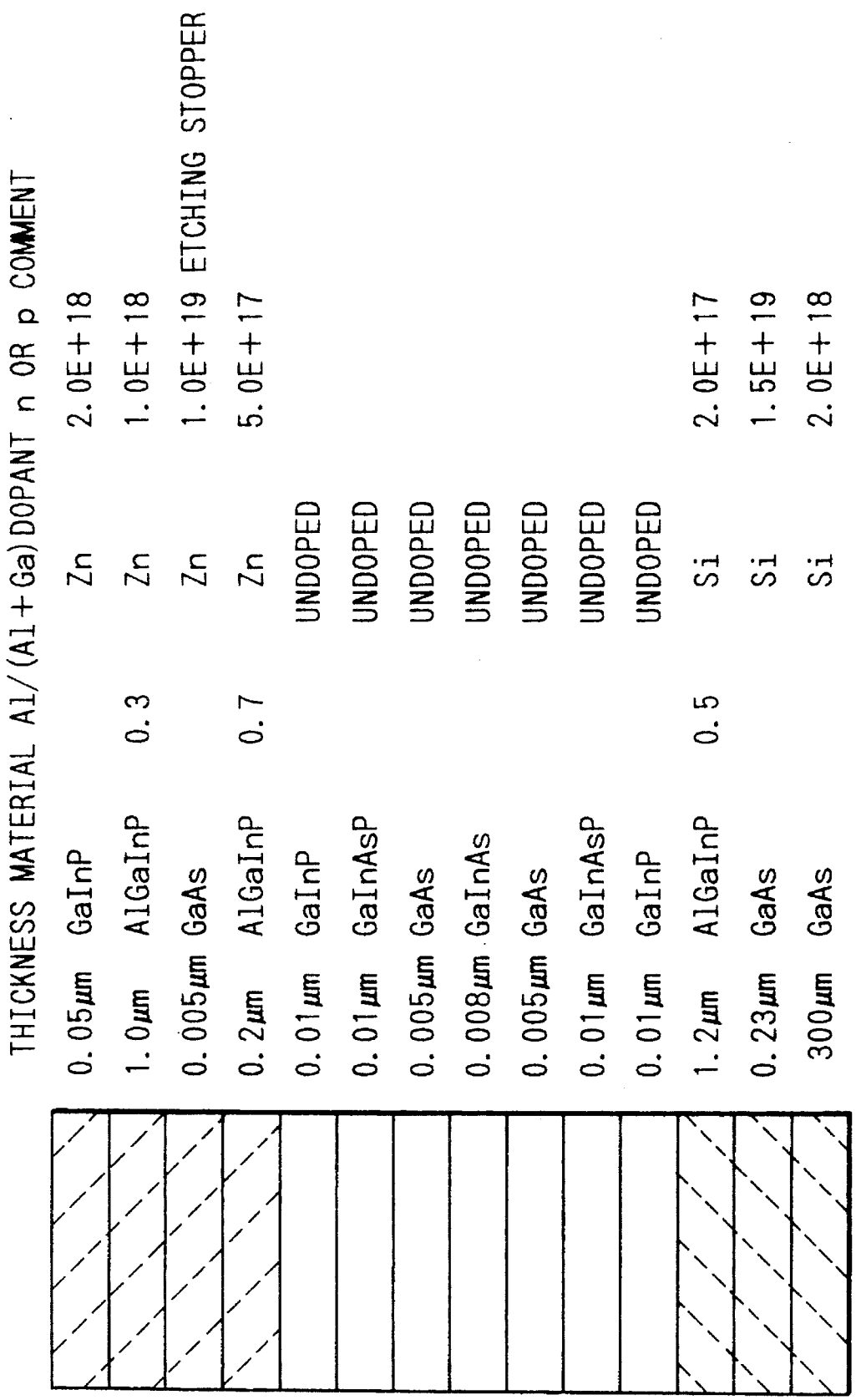
FIG. 11 is a cross-section showing an epitaxial wafer used for producing a semiconductor laser according to a fourth embodiment of the invention.
Figure 12:
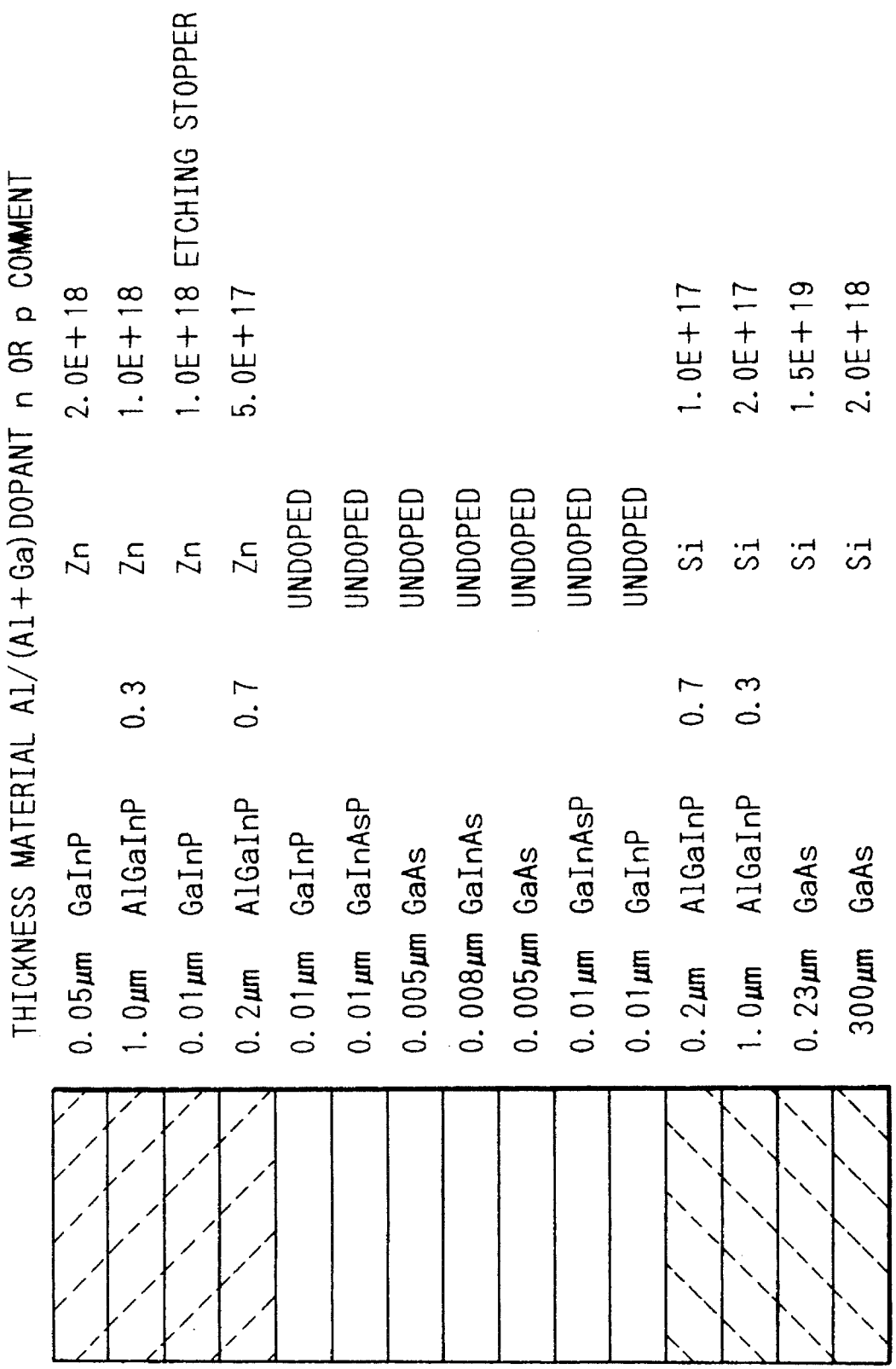
FIG. 12 is a cross-section showing an epitaxial wafer used for producing a semiconductor laser according to a fifth embodiment of the invention.

FIGS. 11–13 show epitaxial wafers according to fourth to sixth embodiments, which are alternatives to the epitaxial wafer 116 of FIG. 2. In the fourth embodiment of FIG. 11, an etching stopper layer of GaAs is employed instead of the etching stopper layer 112 of GaInP of the second embodiment. This change provides larger selection ranges to contribute to stabilization of the manufacturing process. In this embodiment, for instance, a room temperature solution of hydrochloric acid, phosphoric acid and water (22:11:17) may be used as an etchant.

In the fifth embodiment of FIG. 12, an n-side (top) clad and a p-side (bottom) clad are made approximately symmetrical. Even in the second embodiment, the light distributions on the n and p sides can be made identical by adjusting the thickness of the AlGaInP cladding layer 111 and other factors. It is apparent that the epitaxial wafer of the fifth embodiment can equalize the n-side and p-side light distributions more easily.

In the sixth embodiment of FIG. 13, the Al proportion (Al/(Al+Ga)) of a base layer of the top clad is set the same as that of a protrusion strip, to make the large part of the clad have the same composition. This will facilitate the epitaxial growth.

As described above, the semiconductor lasers according to the second to sixth embodiments exhibit good heat dissipation performance because they confine light and current by a structure made of only semiconductor materials. The single transverse mode operation can easily be obtained by virtue of the index antiguiding structure. By changing the thickness and composition of the AlGaInP base layer of the top clad having an Al proportion smaller than that of AlGaInP of the protrusion strip, the optical confinement in both of the vertical and horizontal directions can be controlled.

What is claimed is:

1. A semiconductor laser having a layered structure comprising:

a GaAs substrate;

an active region including a quantum well active layer made of a semiconductor material having a band gap energy smaller than that of GaAs disposed on said substrate;

a first cladding layer made of AlGaInP disposed on said active region; and electrodes in contact with said layered structure.

2. A semiconductor laser according to claim 1, wherein said AlGaInP of said first cladding layer is substantially lattice-matched with GaAs of said substrate and has an Al proportion in terms of Al/(Al+Ga) of not less than 0.5.

3. A semiconductor laser according to claim 1, further comprising:

a protrusion strip for current injection disposed on said first cladding layer, said protrusion strip defining a second cladding layer made of AlGaInP, and a light diffusion layer disposed on said first cladding layer adjacent to said protrusion strip, wherein said first cladding layer has a thickness that allows laser oscillation light to leak out to said light diffusion layer.

4. A semiconductor laser according to claim 3, wherein said light diffusion layer is made of AlGaInP and has an Al proportion smaller than that of said AlGaInP of said second cladding layer and inclusive of zero, and wherein an Al proportion in terms of Al/(Al+Ga) of said AlGaInP of said second cladding layer minus an Al proportion in terms of Al/(Al+Ga) of said AlGaInP of said light diffusion cladding layer is in a range of 0.1 to 0.4.

5. A semiconductor laser according to claim 4, wherein said Al proportion of said light diffusion layer is not more than 0.2.

6. A semiconductor laser according to claim 3, further comprising at least one of a GaAs layer and a GaAsP layer located between said first cladding layer and said light diffusion layer and further located between said protrusion strip and said light diffusion layer.

7. A semiconductor laser according to claim 3, wherein said first cladding layer is made of AlGaInP having an Al proportion larger than said Al proportion of said AlGaInP of said second cladding layer.

8. A semiconductor laser according to claim 3, wherein longitudinal ends of said protrusion strip are spaced from respective laser facets, and said light diffusion layer extends to fill regions between said longitudinal ends of said protrusion strip and said laser facets.

* * * * *